United States Patent [19]
Joyner

[11] Patent Number: 5,352,341
[45] Date of Patent: Oct. 4, 1994

[54] REDUCING LEAKAGE CURRENT IN SILICON-ON-INSULATOR SUBSTRATES

[75] Inventor: Keith A. Joyner, Richardson, Tex.

[73] Assignee: Texas Instruments Incorporated, Dallas, Tex.

[21] Appl. No.: 82,079

[22] Filed: Jun. 24, 1993

[51] Int. Cl.$^5$ ............................................. C25F 3/12
[52] U.S. Cl. ........................... 204/129.1; 204/129.65; 204/129.75
[58] Field of Search ............ 204/129.1, 129.65, 129.75; 437/71

[56] References Cited

PUBLICATIONS

Michael Guerra, "The Status of SIMOX Technology," *Solid State Technology*, Nov. 1990, pp. 75–78.

J. Margail, J. M. Lamure and A. M. Papon, "Defects in SIMOX Structures: Some Process Dependence," *Materials Science and Engineering*, B12 (1992) pp. 27–36.

*Primary Examiner*—John Niebling
*Assistant Examiner*—Edna Wong
*Attorney, Agent, or Firm*—Brian A. Carlson; James C. Kesterson; Richard L. Donaldson

[57] ABSTRACT

In accordance with the present invention, there is provided a method and structure which substantially reduce the leakage current between the surface layer and the substrate silicon that can be caused by the leakage pipes formed in the buried layer in a SIMOX process. A novel solution to this problem is to etch the silicon in these pipes by using an anodizing process. A preferred embodiment of this invention comprises the steps of exposing the surface layer (e.g. silicon 34) to an electrolytic solution (e.g dilute HF acid 38), and creating a potential difference between the substrate (e.g. silicon 30) and the solution, thereby causing current to flow through the leakage pipes (e.g. silicon 36) in the buried insulator layer (e.g. $SiO_2$ 32), thereby causing the solution to etch a portion of the surface silicon that is essentially above the leakage pipes, and to substantially etch the silicon in the leakage pipes, thus substantially reducing the leakage current paths between the substrate and the surface layer. Since the leakage current is generally detrimental to the performance of SIMOX devices, the clean removal of the silicon in the pipes will generally help improve the performance and increase the yield of SIMOX devices.

11 Claims, 4 Drawing Sheets

REDUCING LEAKAGE CURRENT IN SILICON-ON-INSULATOR SUBSTRATES

This invention was made with government support under F33615-89-C-5714 awarded by the United States Air Force. The government has certain rights in this invention.

FIELD OF THE INVENTION

This invention generally relates to integrated circuits, and more particularly to reducing leakage current in silicon-on-insulator substrates.

BACKGROUND OF THE INVENTION

Ion implantation is an alternative method to diffusion for injecting impurities into a semiconductor layer. Ion implantation is typically a process in which ions that have been accelerated by several kilovolts are made to penetrate a solid surface such as silicon, and, unlike the ions in a typical diffusion process, can be made to do this at room temperature. Ion implantation generally produces the maximum concentration of implanted material beneath the surface of the wafer. Because the implanted dopants are generally not in the proper lattice position and are mostly electrically inactive, a high temperature annealing process is often used which repairs crystal damage and electrically activates the dopants.

Implantation of oxygen into silicon is generally a preferred process for building silicon-on-insulator (SOI) substrates which can be used, for example, in very large scale integration (VLSI) devices. This separation by implantation of oxygen (SIMOX) process generally involves three steps:

A) A standard silicon wafer is cleaned in a clean room ambient to substantially remove any received contaminants.

B) Oxygen is implanted under the surface of the wafer at relatively high energy (e.g. $2 \times 10^{18}/cm^2$ of oxygen atoms at 200 keV).

C) The wafer is annealed at high temperature (e.g. greater than about 1300° C. for 6 hours) to substantially repair implant damage and form the buried oxide layer.

SIMOX wafers are of interest because they can generally be used to provide one or more of the following advantages over bulk silicon wafers:

A) better radiation hardness
B) higher speed performance
C) higher temperature operation
D) lower power devices
E) lower cost process for some applications
F) easier implementation of submicrometer design rules.

Recent improvements in the quality of SIMOX wafers, along with the advent of readily available processing equipment, have helped to stimulate an increased interest in SIMOX technology. "The Status of SIMOX Technology" by Michael A. Guerra, *Solid State Technology*, November 1990, pp. 75–78, discusses SIMOX technology and advances in the field.

SUMMARY OF THE INVENTION

Although SIMOX material quality has improved significantly in the past decade, there are generally still some remaining defects, such as dislocations, stacking faults and buried oxide discontinuities, in SIMOX structures. These are discussed in more detail in "Defects in SIMOX structures: some process dependence" by J. Margail, et al., *Materials Science and Engineering*, Jan. 20, 1992, pp. 27–36. The buffed oxide discontinuities, hereinafter referred to as "pipes" or "leakage pipes", can be caused by particles at the surface that alter the ion beam synthesis of the buried oxide layer by a shadowing effect. SIMOX material can have an appreciable density of these pipes, or conductive silicon channels, through the buried oxide. The pipes can lower the quality of the buried oxide, and in particular reduce the dielectric isolation efficiency between the surface silicon and the buried oxide, and thus influence the yield of circuits processed on the SIMOX material. For example, in substantially altering the insulating properties of the buried oxide layer, the pipes can cause a higher leakage current in devices built over them. The intrinsic leakage of the buried insulator is very low, but one of these pipes can cause milliamps of leakage. Therefore it is generally desired and beneficial to substantially modify or eliminate the pipes so as to reduce this leakage current and thus obtain improved performance.

In accordance with the present invention, there is provided a method and structure which substantially reduce the leakage current between the surface silicon and the substrate silicon that can be caused by the pipes produced in a SIMOX process. A novel solution to this problem is to etch the silicon in these pipes by using an anodizing process. As used herein, the term "anodize" means the use of a liquid or solid that conducts electricity by the flow of ions. One of the advantages of this process is that the silicon in the pipes is substantially eliminated so that there will be little or no leakage current between the surface silicon and the substrate silicon through the pipes. Since the leakage current is generally detrimental to the performance of SIMOX devices, the clean removal of the silicon in the pipes will generally help improve the performance and increase the yield of SIMOX devices.

One embodiment of this invention is a separation by implantation of oxygen structure comprising a silicon substrate, a buried insulator layer overlaying the silicon substrate, wherein the buried insulator has few or no silicon leakage pipes, a surface silicon layer overlaying the buried insulator, and one or more etched channels extending from the surface layer down through the buried insulator layer to the substrate, whereby the leakage current between the substrate and the surface layer is substantially less than the leakage current of a SIMOX structure having substantially unetched silicon leakage pipes.

A method of forming an embodiment of this invention involves the etching of the silicon in one or more of the leakage pipes in a SIMOX wafer, wherein the leakage pipes connect the substrate and the surface layer through the buried insulator layer. This method comprises the steps of exposing the surface layer to an electrolytic solution, wherein the solution does not substantially etch the surface layer without a predetermined potential difference between the wafer and the solution, but does etch the surface layer if the potential difference does exist between the wafer and the solution, and creating a potential difference between the substrate and the solution, thereby causing current to flow through the leakage pipes, thereby causing the solution to etch a portion of the surface silicon that is essentially above the leakage pipes, and to substantially etch the silicon in the leakage pipes, whereby etching the silicon from the leakage pipes substantially reduces the leakage current paths between the substrate and the surface layer.

These are apparently the first SIMOX structures in which the silicon in the leakage pipes is etched away, thus substantially reducing the leakage current paths from the surface layer to the silicon substrate. An advantage of this novel SIMOX method and structure is an increase in the low leakage current yield. Also, since the etching is done before the fabrication of any integrated circuits, this process can be used to screen of wafers for high buried insulator leakage. These improved SIMOX structures are especially beneficial for low leakage current applications (e.g. battery powered systems and space applications).

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

Figure 1:
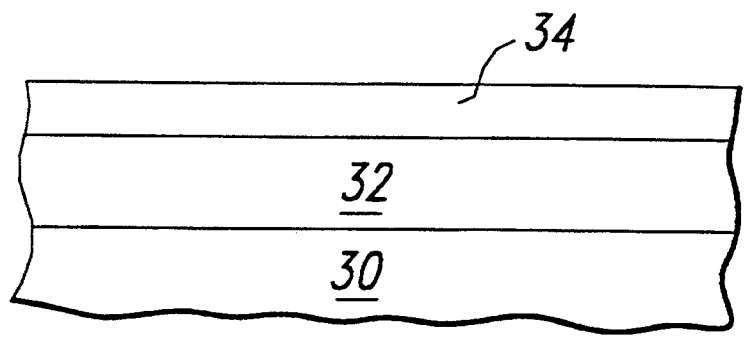
FIG. 1 is a cross-sectional view of the three principle layers in a typical SIMOX wafer.
Figure 2:
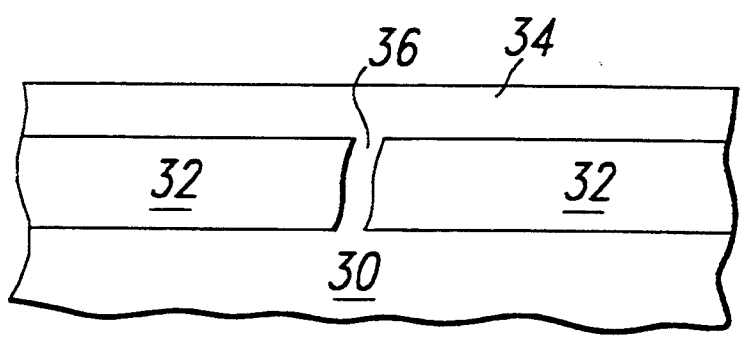
FIG. 2 is a cross-sectional view of a leakage pipe in a typical SIMOX wafer.

FIG. 1 illustrates a cross-section of a typical SIMOX wafer, wherein a 400 nm buried $SiO_2$ layer 32 and a 250 nm surface silicon layer 34 have been formed on a silicon substrate 30 using the SIMOX process. FIG. 2 illustrates a cross-section of a SIMOX wafer with a leakage pipe 36 through the buried $SiO_2$ layer 32. Such a leakage pipe 36 can be caused by a particle lying on the surface of the wafer during SIMOX ion implant. After annealing, the intrinsic leakage of the buried $SiO_2$ layer 32 is in general very low, but the leakage pipe 36 can cause milliamps of current leakage from the surface silicon layer 34 to the silicon substrate 30.

Figure 3:
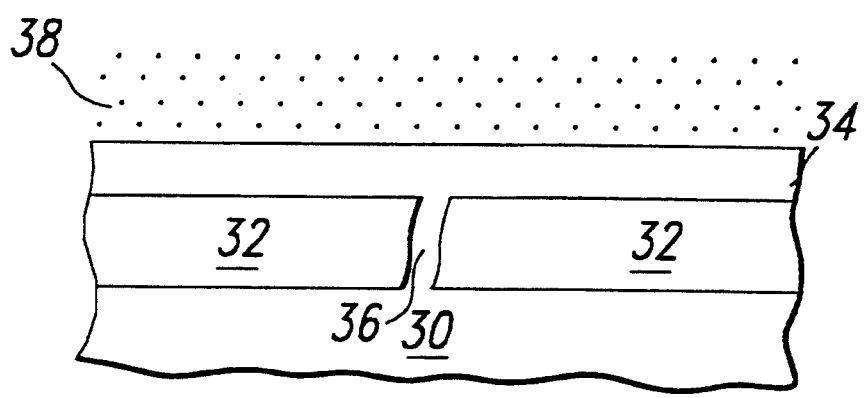
FIGS. 3-8 are cross-sectional views of a method for removing material from the pipes in the buried oxide layer of a SIMOX wafer.

With reference to FIGS. 3-8, there is shown a method of forming a preferred embodiment of this invention, a SIMOX structure with the silicon in the leakage pipes etched away, leaving non-conductive, etched channels. By using an anodizing process, the silicon in and near the leakage pipes 36 can be removed selectively while leaving the remainder of the surface layer 34 substantially unaffected. FIG. 3 illustrates the exposure of electrically grounded, dilute HF acid 38 to the surface of the surface silicon layer 34. The concentration of the acid 38 is low enough such that, under these conditions, substantial etching of the surface layer 34 does not occur. However, when a positive (or negative) voltage is applied to the substrate 30, an electric field is set up between the acid 38 and the substrate 30, causing current to flow through the conductive leakage pipe 36.

Figure 4:
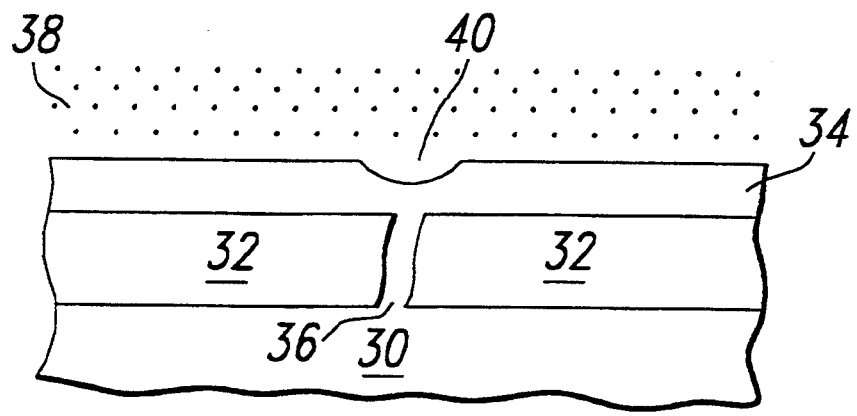
Figure 5:
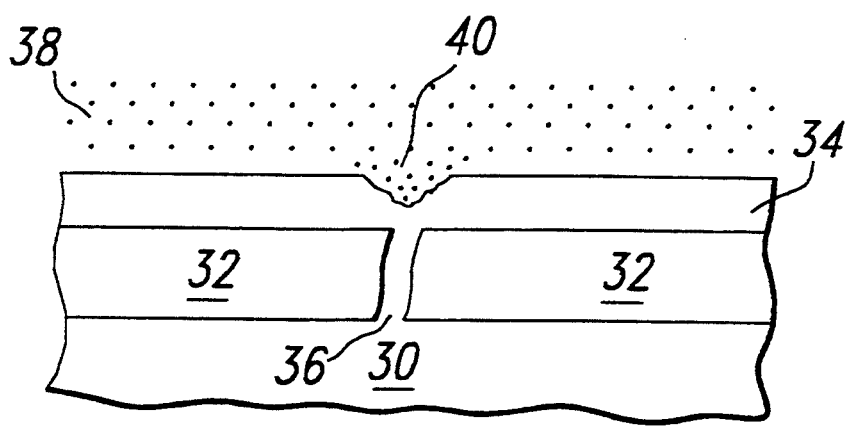
Figure 6:
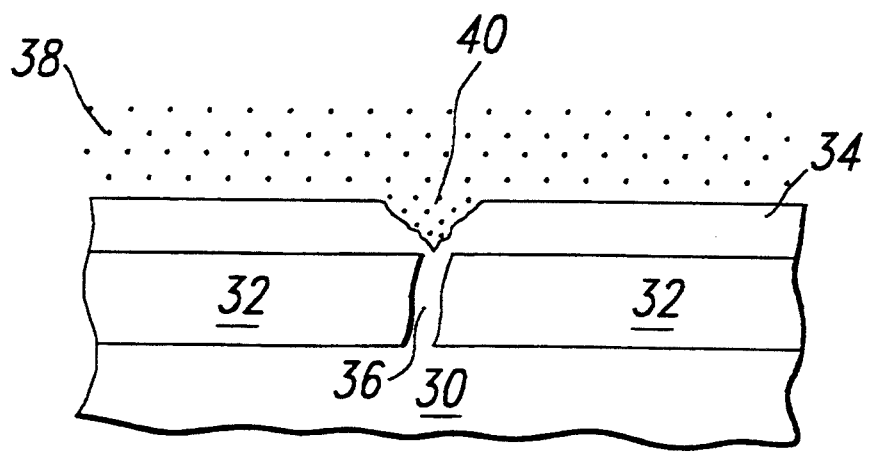

FIG. 4 illustrates the wafer after a positive voltage has been applied to the substrate 30. Current flowing through the electrolyte 38 causes a chemical change in the silicon, etching it away and foraging the start of an etch channel 40. This decomposition etching of the surface silicon 34 is primarily focused on the area just above the leakage pipe 36, since this is generally the area of highest current density. This is because the surface silicon 34 generally has high resistivity, so the current will generally be crowded into a narrow channel above the leakage pipe 36. FIGS. 5 and 6 illustrate the process as the etched channel 40 continues to grow toward the leakage pipe 36. Etching of the surface silicon 34 is self-limiting; once the surface silicon 34 above the leakage pipe 36 has been etched through, there will be negligible lateral etching of the remaining surface silicon 34 since there is no longer current flowing through it. The only appreciable silicon etching after that point will be down into the pipe 36, along with a minor amount of etching of the buried $SiO_2$ 32 at the edge of the pipe 36. Etching of the $SiO_2$ 32 will be slow because the HF acid 38 is diluted, and experience has shown that the buried $SiO_2$ 32 etches at about half the rate of normal thermal oxide.

Figure 7:
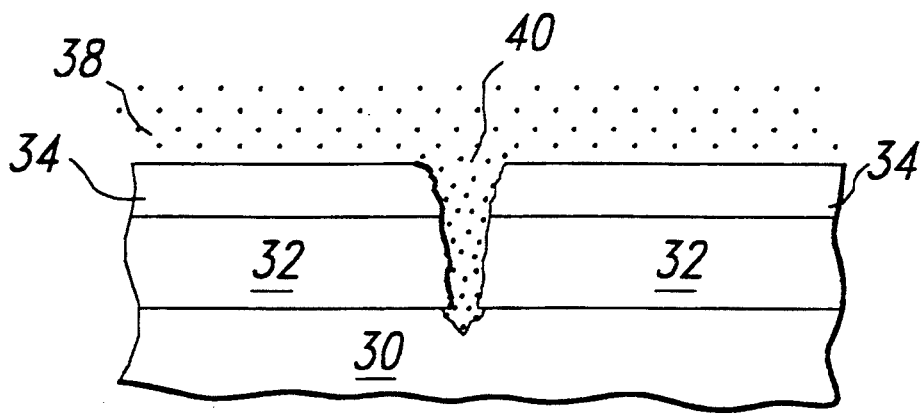
Figure 8:
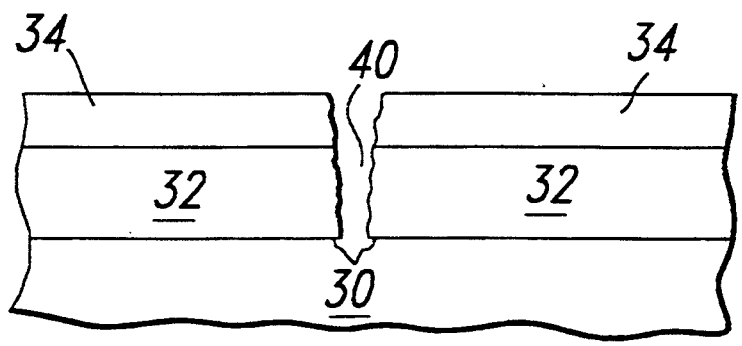

FIG. 7 illustrates the etched channel 40 after the acid 38 has etched away the pipe down to the substrate 30. Etching of the silicon below the pipe will generally continue as long as there is sufficient voltage applied across the wafer. Etching of the substrate 30 is not self-limiting, therefore the process will generally have to be timed in order to substantially remove the pipe 36, but not remove too much of the underlying substrate 30. This time is generally best determined experimentally. Generally, to essentially make a leakage pipe non-conductive, the leakage pipe can be either completely or only partially etched away. FIG. 8 illustrates the structure resulting from this anodizing process, an open, non-conductive channel 40 through the surface silicon 34 and the buried $SiO_2$ 32. Generally, if the channel is filled with $SiO_2$ or $Si_3N_4$, it would still remain non-conductive. Generally, narrow non-conductive channels would remain non-conductive throughout the process of integrated circuit (IC) fabrication, generally resulting in lower leakage current devices. Generally, an electrical open is created in the surface silicon, but this is generally preferred to a short caused by a leakage pipe, which can cause much more widespread problems.

Figure 9:
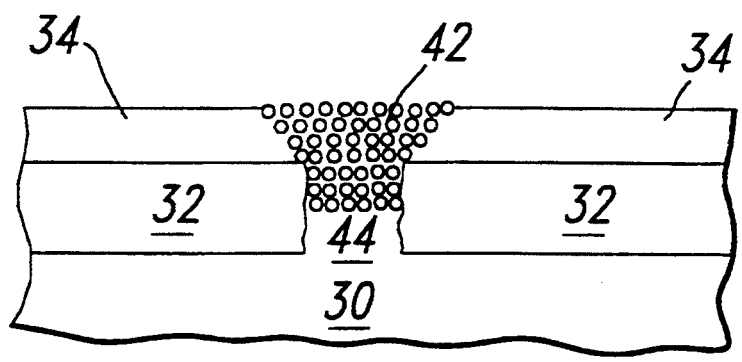
FIG. 9 is a cross-sectional view of an etched leakage pipe with a porous silicon layer covering the etch cavity.
Figure 10:
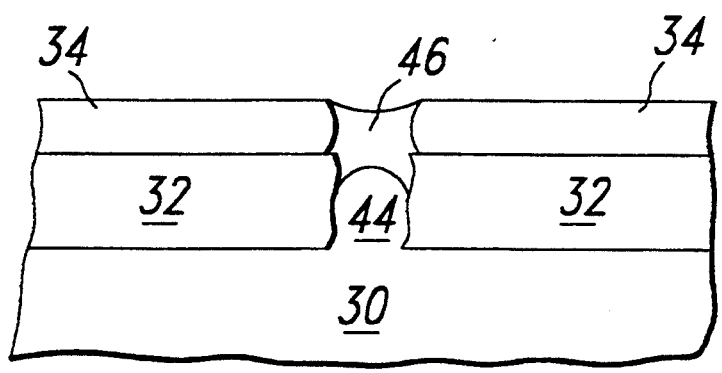
FIG. 10 is a cross-sectional view of an etched leakage pipe with an $SiO_2$ plug covering the etch cavity.

In an alternate embodiment, FIG. 9 illustrates a cross section of a leakage pipe that has been etched using different etch conditions (e.g. etchant concentrations and currents). Instead of forming a substantially clear channel through the pipe, the etch conditions are modified so as to produce a porous silicon layer 42 over the partially etched leakage pipe 44. With reference to FIG. 10, this porous silicon matrix can be oxidized to form a "plug" of $SiO_2$ 46, which would fill the top of the etched channel, and substantially reduce the amount of leakage current caused by the leakage pipe.

Figure 11:
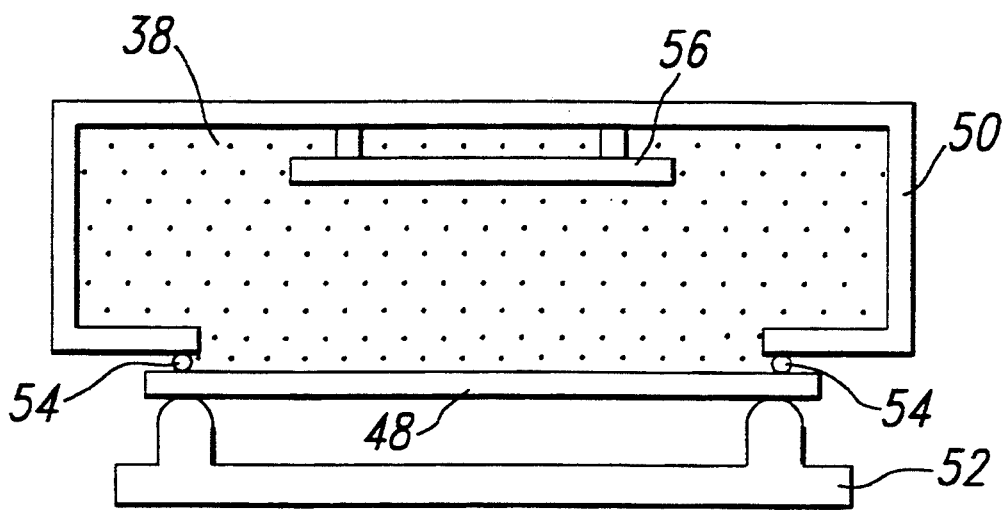
FIG. 11 is a cross-sectional view of a SIMOX wafer being etched in a tank of electrolyte.
Figure 12:
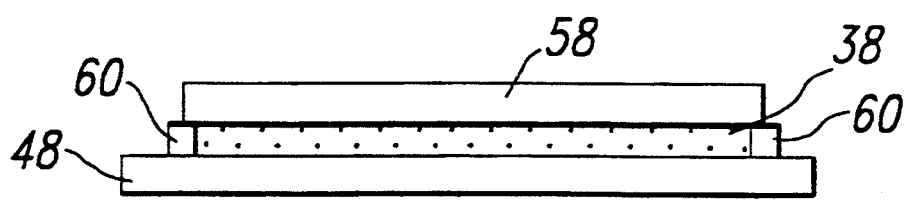
FIGS. 12-13 are cross-sectional views of alternate methods of etching a SIMOX wafer.
Figure 13:
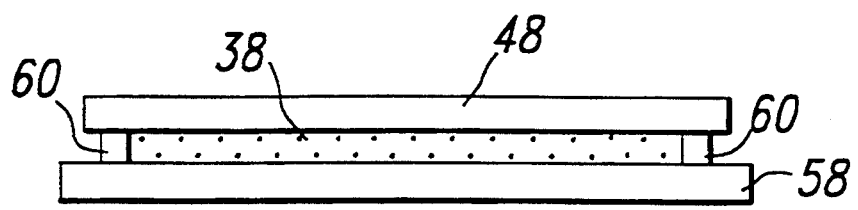

With reference to FIGS. 11-13, there are shown various methods of anodizing a SIMOX wafer. FIG. 11 illustrates a tank 50 containing acid 38 and an electrode 56, with a clamp 52 holding the wafer 48 in place, and insulating seals 54 on the front of the wafer 48 to prevent the acid 38 from contacting the back of the wafer 48.

In an alternate embodiment, FIG. 12 illustrates a planar electrode 58 which is positioned to be in contact with a small pool of acid 38 resting on the surface of the wafer 48. Insulating spacers 60 assist in keeping the acid 38 on the wafer, and in supporting the planar electrode 58.

In another alternate embodiment, FIG. 13 illustrates a setup similar to the one shown in FIG. 12, but with the planar electrode 58 on the bottom, supporting the acid 38, and with the wafer 48 held above, in contact with the acid 38 and spacers 60.

The sole table, below, provides an overview of some embodiments and the drawings.

TABLE

| Drawing Element | Preferred or Specific Examples | Generic Term | Other Alternate Examples |
|---|---|---|---|
| 30 | Si | Substrate | |
| 32 | 350–550 nm thick $SiO_2$ | Buried insulator | 10–600 nm thick $SiO_2$ Other insulators (e.g. $Si_3N_4$) |
| 34 | 100–350 nm thick Si | Surface layer | 50–450 nm thick Si |
| 36 | Si | Leakage pipe | |
| 38 | dilute HF acid | Electrolyte | Other Si etchants (e.g. other F and Cl containing solutions) |
| 40 | | Etched channel | |
| 42 | Si | Porous matrix | |
| 44 | Si | Partially etched leakage pipe | |
| 46 | $SiO_2$ | Plug | $Si_3N_4$ |
| 48 | | SIMOX wafer | |
| 50 | | Etching tank | |
| 52 | | Clamp | |
| 54 | | Insulating seal | |
| 56 | | Electrode | |
| 58 | | Planar Electrode | |
| 60 | | Insulating spacer | |

A few preferred embodiments have been described in detail hereinabove. It is to be understood that the scope of the invention also comprehends embodiments different from those described, yet within the scope of the claims. With reference to the structures described, electrical connections to such structures can be ohmic, rectifying, capacitive, direct or indirect, via intervening circuits or otherwise. Implementation is contemplated in discrete components or fully integrated circuits. In general the preferred or specific examples are preferred over the other alternate examples.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of etching silicon from one or more silicon leakage pipes in a SIMOX wafer, said wafer comprising a silicon substrate, a buffed insulator layer overlaying said substrate, and a surface silicon layer overlaying said buffed insulator, wherein said leakage pipes connect said substrate and said surface layer through said buried insulator, said method comprising:

a. exposing said surface layer to an electrolytic solution, wherein said solution does not substantially etch said surface layer without a predetermined potential difference between said wafer and said solution, but does etch said surface layer if said potential difference does exist between said wafer and said solution; and b. creating said potential difference between said wafer and said solution, thereby causing current to flow through said leakage pipes, thereby causing said solution to etch a portion of said surface silicon that is essentially above said leakage pipes, and to substantially etch said silicon in said leakage pipes, whereby etching the silicon from the leakage pipes substantially reduces the leakage current paths between the substrate and the surface layer.

2. The method according to claim 1, wherein substantially all of said silicon leakage pipes in said wafer are etched.

3. The method according to claim 1, said method further comprising forming a patterned insulating mask on said surface layer prior to said exposure to said electrolyte, whereby the masked portions of said wafer do not undergo any substantial electrolytic etching.

4. The method according to claim 1, wherein said predetermined potential difference and said electrolytic solution are selected such that said etching of said surface silicon forms a porous silicon layer over and partially in said etched leakage pipe, and said porous silicon is then oxidized.

5. The method according to claim 1, wherein said buried insulator is silicon dioxide.

6. The method according to claim 1, wherein said buried insulator is silicon nitride.

7. The method according to claim 1, wherein said buried insulator is between 10 nm and 600 nm thick.

8. The method according to claim 1, wherein said surface layer is between 50 nm and 450 nm thick.

9. The method according to claim 1, wherein said electrolytic solution is dilute HF acid.

10. The method according to claim 1, wherein said wafer is positive with respect to said electrolytic solution.

11. The method according to claim 1, wherein said wafer is negative with respect to said electrolytic solution.

* * * * *